(12) United States Patent
Hahn

(10) Patent No.: US 6,985,702 B2
(45) Date of Patent: Jan. 10, 2006

(54) TRANSCEIVER WITH FREQUENCY MULTIPLIER TRACKED TO FREQUENCY GENERATOR

(75) Inventor: Wilhelm Steffen Hahn, Los Altos, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 688 days.

(21) Appl. No.: 09/792,235

(22) Filed: Feb. 23, 2001

(65) Prior Publication Data

US 2002/0119759 A1 Aug. 29, 2002

(51) Int. Cl.
*H04B 1/40* (2006.01)
*H04B 1/04* (2006.01)
*H04B 15/00* (2006.01)

(52) U.S. Cl. .................. 455/77; 455/76; 455/114.1; 455/112; 455/118; 455/120; 455/313

(58) Field of Classification Search .......... 455/114.123, 455/112, 118, 120, 313, 317, 84, 86, 87, 76, 455/77
See application file for complete search history.

(56) References Cited

U.S. PATENT DOCUMENTS 4,153,876 A * 5/1979 Cochran ..................... 455/84
5,392,460 A * 2/1995 Mattila et al. ............... 455/76
5,903,196 A 5/1999 Ponce et al.

OTHER PUBLICATIONS

"Low Voltage RF Transceiver—With Frequency Multiplier Tracked to Frequency Generator", Philips Data Sheet SA2420, May 23, 1997, 16 pages.

\* cited by examiner

*Primary Examiner*—Vivian Chin
*Assistant Examiner*—Yuwen Pan

(57) ABSTRACT

A transceiver has frequency generating means for generating a first signal at a first frequency. The frequency generating means has first tank means for resonating at the first frequency. The transceiver further has frequency multiplication means for multiplying the first signal by an integral multiple of a fundamental frequency of the first signal. The frequency multiplication means has second tank means for resonating at a harmonic frequency of the fundamental frequency, the harmonic frequency being determined by the integral multiple. The frequency multiplication means has output means for outputting a second signal at the harmonic frequency. The first tank means is highly frequency selective around the first frequency, and the second tank means is highly frequency selective around the harmonic frequency. The transceiver has tuning means for simultaneously tuning the first and second tank means, and has up/down-conversion means for up/down-converting the second signal.

20 Claims, 3 Drawing Sheets

TRANSCEIVER WITH FREQUENCY MULTIPLIER TRACKED TO FREQUENCY GENERATOR

BACKGROUND OF THE INVENTION

1. Field of the Invention

The present invention relates to a transceiver with a frequency multiplier for multiplying a signal produced by a frequency generator that is included in the transceiver. The frequency generator and the frequency multiplier may be shared between a receiver and a transmitter comprised in the transceiver. Such a transceiver can be a device under the so-called WLAN IEEE 802.11b Standard, or can be any other suitable radio frequency device. The device may also be a separate transmitter or receiver.

2. Description of the Related Art

Philips Data Sheet SA2420, "Low Voltage RF Transceiver—2.45 GHz", 16 pages, May 23, 1997, discloses a transceiver front-end with a transmitter and a receiver front-end. The transceiver has a frequency doubler that, through a band pass filter provides a local oscillator signal to a mixer. The frequency doubler doubles the frequency of a signal generated by a frequency generator. Such a frequency generator typically is formed of a voltage-controlled oscillator comprised in a phase locked loop, but other types of frequency generators are known. The voltage-controlled oscillator typically has a tank circuit with capacitors and inductors and is tuned by a tuning voltage supplied thereto. Known transceivers using such a SA2420 integrated circuit use a wideband frequency doubler in which the loaded quality factor (Q) of the tank circuit is low, typically 2–3 i.e. the tank circuit has low frequency selectivity. Because of the low Q, the gain is flat over frequency and the transceiver has nearly no suppression of unwanted frequencies at the fundamental frequency, and at uneven multiples thereof. Such unwanted frequencies cause an unwanted reception or decrease blocking immunity in the receive mode of the transceiver and have to be filtered out off-chip, particularly when the transceiver is in transmit mode.

More generally, similar principles apply to known frequency multipliers comprised in transceivers.

SUMMARY OF THE INVENTION

It is an object of the invention to provide frequency multiplication in a transceiver, transmitter or receiver with an effective suppression of harmonics related to a generated frequency signal, without the need to apply substantial attenuation.

In accordance with the invention, a transceiver is provided, said transceiver comprising:

frequency generating means for generating a first signal at a first frequency, said frequency generating means including first tank means for resonating at said first frequency;

frequency multiplication means for multiplying said first signal by an integral multiple of a fundamental frequency of said first signal, said frequency multiplication means including second tank means for resonating at an harmonic frequency of said fundamental frequency, said harmonic frequency being determined by said integral multiple, and said frequency multiplication means including output means for outputting a second signal at said harmonic frequency, said first tank means being highly frequency selective around said first frequency, and said second tank means being highly frequency selective around said harmonic frequency;

tuning means for simultaneously tuning said first and second tank means.

In such a transceiver, the second signal may be used for up-conversion, down-conversion, or both up-conversion and down-conversion. In principle, the invention can be used in a transmitter-only or a receiver-only device.

The invention is based on the insight that high frequency selectivity that is needed to suppress undesired uneven harmonics causes the overall frequency characteristic not to be flat anymore, and therefore needs to be compensated for by tuning the tank circuits with small frequency increments. Effectively, it is herewith achieved that the overall frequency characteristic becomes flat again.

Preferably, the tank circuits comprise matched on-chip frequency determining elements built from unitary capacitors and inductors. Preferably, also active elements in the frequency generating means and frequency multiplying means are matched on-chip elements, such as bipolar transistors having equal emitter areas, or field effect transistors having unitary channel dimensions. Herewith, good tracking over the whole desired frequency band is achieved.

By applying a high pass filter at an output side of the frequency multiplying means, before up-conversion and/or down-conversion, the fundamental frequency is further suppressed.

Preferably, multiples of unitary capacitive and inductive elements in the oscillator tank circuit are chosen the same. Herewith, minimum tracking errors are obtained.

BRIEF DESCRIPTION OF THE DRAWING

Throughout the figures the same reference numerals are used for the same features.

DESCRIPTION OF THE DETAILED EMBODIMENTS

Figure 1:
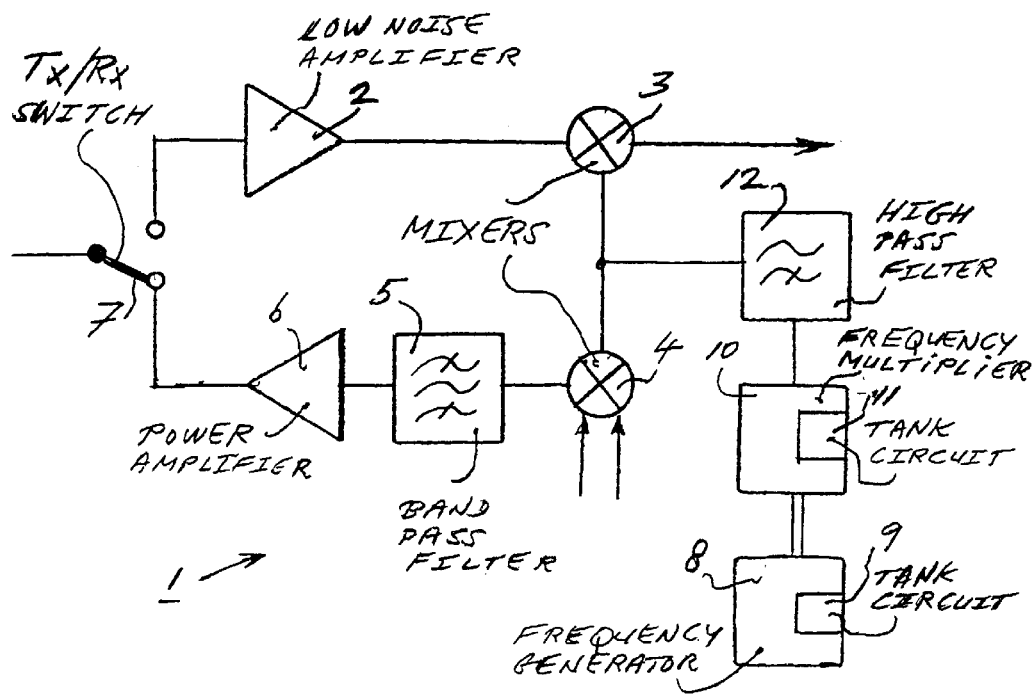
FIG. 1 is block diagram of a transceiver according to the invention.

FIG. 1 is block diagram of a transceiver 1 according to the invention. In a receive branch, the transceiver 1 comprises a low noise amplifier 2 and a mixer 3, and in a transmit branch, the transceiver 1 comprises a mixer 4, a band pass filter 5, and a power amplifier 6. The transmit and receive branches are coupled to a transmit/receive (Tx/Rx) switch 7. The transceiver 1 further comprises a frequency generator 8 with a tank circuit 9, a frequency multiplier 10 with a tank circuit 11, and, optionally, a high pass filter 12. According to the invention, the tank circuits 9 and 11 are highly selective, are tunable, and are operated in a frequency tracking mode, i.e., are operated to closely track one another in frequency when being tuned. In fact, the tank circuits 9 and 11 are tuned simultaneously, preferably by applying the same tuning voltage. Highly preferable, frequency determining elements, such as inductive elements and capacitive elements, and active elements in the respective tank circuits 9 and 11 are matched. When implemented on-chip, such matching includes manufacturing inductors as unitary inductive elements and capacitors as unitary capacitive elements, and manufacturing active elements such as transistors of a standard geometry, by applying equal emitter areas in case of bipolar transistors, for instance. In case field effect transistors are used, such field effect transistors are matched by applying unitary channel dimensions. Such accurate matching achieves accurate frequency tracking. In the example given, the frequency multiplier 11 is dimensioned so as to operate as a frequency doubler, i.e., the tank circuit 11 resonates at twice the output frequency of the frequency generator 8, and, because of its high selectivity substantially filters out all other harmonics. In principle, the frequency multiplier 10 may select other harmonics, such as the third harmonic. In case of selecting the third harmonic, the frequency multiplier operates as a frequency tripler.

A multiplied frequency generator frequency may be applied to both mixers 3 and 4 of the receive and transmit branches, may be applied to the transmit branch only, or may be applied to the receive branch only. Either the transmit branch or the receive branch may be dispensed with. In the latter case, instead of a transceiver, the device is a transmitter-only or a receiver-only, respectively.

The high pass filter 12 is optional and achieves further filtering out of the fundamental frequency signal provided by the frequency generator 8.

The frequency generator 8 may be implemented in numerous ways. For instance, the frequency generator 8 comprises a voltage controlled oscillator included in a phase locked loop. Alternatively, the frequency generator 8 may be a single oscillator, or a complicated synthesizer. The construction of the frequency generator 8 is not essential to the present invention.

The frequency multiplier 11 may be implemented in numerous ways, as long as it comprises a highly selective and tunable tank circuit. The tank circuits 9 and 11 may also be implemented in numerous ways. In the art, as such, many tunable and highly selective tank circuits are known and tuning of such tank circuits by analog, or by hybrid analog and digital means. Tuning may be done by applying varicaps or varactors, PIN diode switched capacitor arrays, switched inductor arrays, transistor switched capacitor arrays, or any other suitable tuning means.

Figure 2:
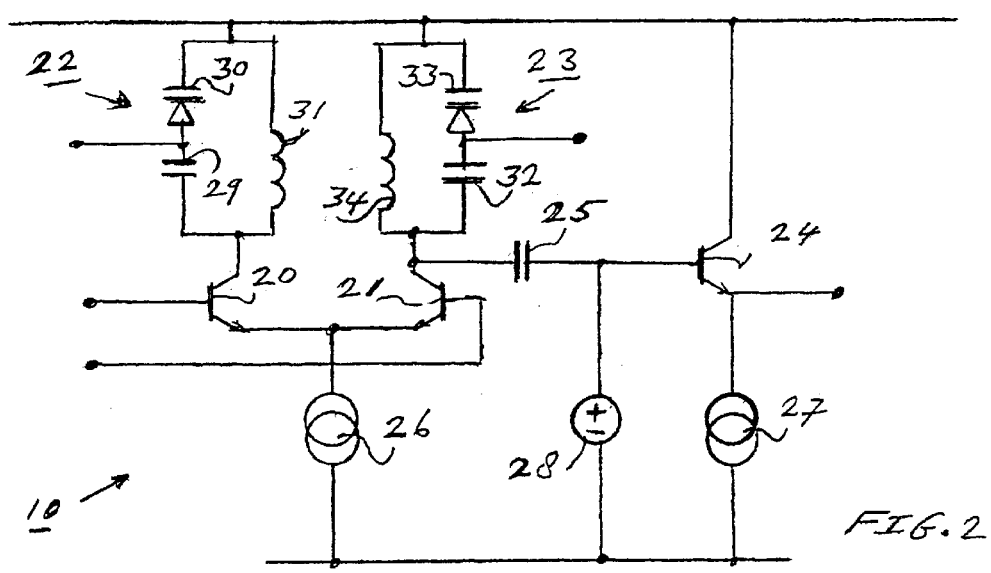
FIG. 2 is a circuit diagram of a frequency multiplier according to the invention.

FIG. 2 is a circuit diagram of the frequency multiplier 10 according to the invention, in the example given dimensioned as a frequency doubler. The frequency multiplier 10 comprises a balanced pair of input transistors 20 and 21 with tunable tank circuits 22 and 23 in their respective collector paths, and an output transistor 24 that is configured as an emitter follower. Further shown are a coupling capacitor 25, current sources 26 and 27, and a voltage source 28. The tunable tank circuit 22 comprises a capacitor 29, a varicap or varactor 30, and an inductor 31. The tunable tank circuit 23 comprises a capacitor 32, a varicap or varactor 33, and an inductor 34.

Figure 3:
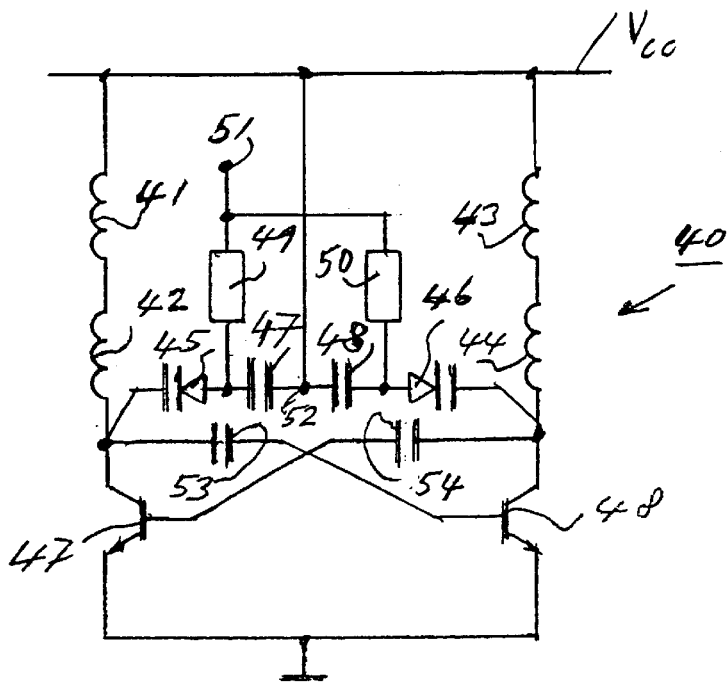
FIG. 3 shows a tank circuit in a voltage controlled oscillator circuit according to the invention.

FIG. 3 shows a tunable tank circuit 40 in a voltage controlled oscillator circuit according to the invention. The tunable tank circuit 40 comprises inductors 41, 42, 43 and 44, varicaps 45 and 46, capacitors 47 and 48, and resistors 49 and 50. At node 51 a tuning voltage may be applied. Node 52 between capacitors 47 and 48 couples the tuning circuit formed by the capacitors 47 and 48, the varicaps 45 and 46, and the resistors 49 and 50 to supply $V_{cc}$. Further shown are coupling capacitors 53 and 54 for respective coupling of transistors 47 and 48 of the voltage controlled oscillator (not shown in further detail). The tank circuit 40 substantially is the frequency determining element in the voltage controlled oscillator. The tank circuit 40 may be tuned using varicaps, similarly as shown in the frequency multiplier 10, but many alternative tuning mechanisms are known in the art, as described with respect to FIG. 1. Essential is that the tunable tank circuits 9 and 11 match so as to allow accurate tracking.

As described, in the tank circuits 22, 23, and 40 preferably on-chip unitary inductive and capacitive elements are applied. In case of a frequency doubler, inductors 41 and 42 together have double inductance of inductors 31 or 34, and capacitor 45 has double capacitance of capacitor 29 and 30, or 32 and 33. Herewith, minimal tracking errors are obtained. Alternatively, inductance may be four-fold and capacitance equal. Alternatively, capacitance may be four-fold and inductance equal. With such alternative choices, due to expected higher influence of component spread, tracking errors may be higher. For a frequency tripler, both capacitance and inductance may be three-fold in the oscillator tank circuit.

Figure 4:
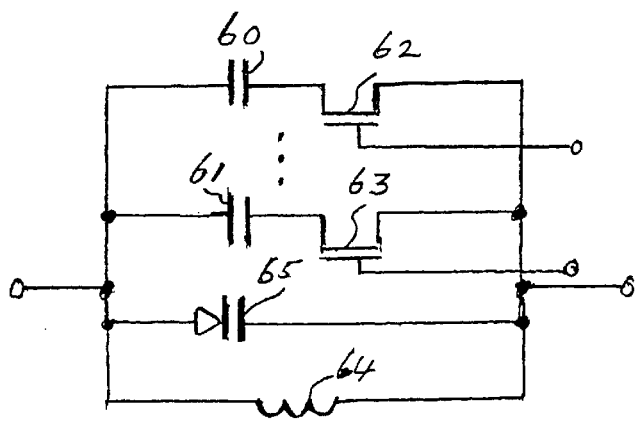
FIG. 4 shows capacitive tuning of a tank circuit.

FIG. 4 shows an alternative way of capacitive tuning of a tank circuit. The alternative tunable tank circuit comprises an array of switched capacitors 60 and 61, switched by field effect transistors 62 and 63, an inductor 64, and a varicap 65. In principle, the varicap 65 may be dispensed with.

Figure 5:
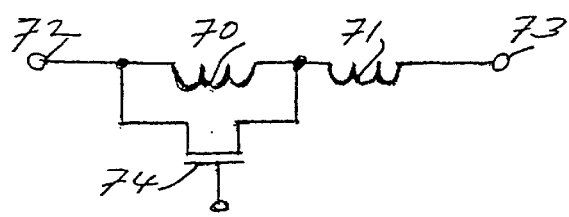
FIG. 5 shows tuning of an inductor for use in a tank circuit.

FIG. 5 shows tuning of an inductor for use in a tank circuit. As shown, one of a pair of series arranged inductors 70 and 71, arranged between nodes 72 and 73, is switched by field effect transistor 74.

Figure 6:
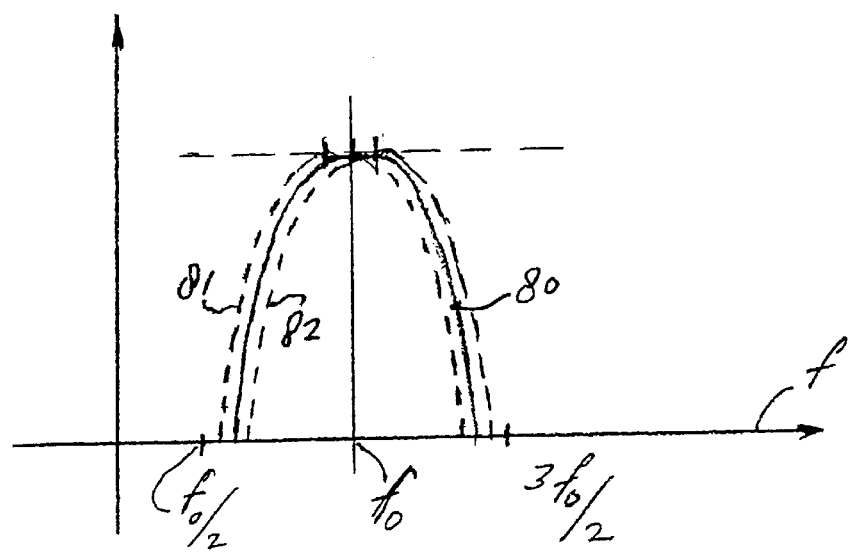
FIG. 6 illustrates operation of the invention.

FIG. 6 illustrates operation of the invention. A solid line, highly selective frequency characteristic 80 shows frequency selection of a second harmonic, by the tank circuits 22, 23 and 40, at a frequency $f=f_0$, in the middle of a given frequency band, e.g., 2.45 GHz in a band of 2.4 GHz–2.5 GHz, and suppression of fundamental frequency $f_0/2=1.225$ GHz and of higher harmonics such as the third harmonic at frequency $f=3f_0/2=3.675$ GHz. Dashed line frequency characteristics 81 and 82 are frequency characteristics at outer edges of the frequency band, at 2.4 GHz and 2.5 GHz, respectively. Also at the edges, the frequency characteristic of the oscillator tank circuit tracks the frequency characteristic of the frequency doubler tank circuit, i.e., the oscillator to 1.2 GHz and 1.25 GHz, respectively. As shown in FIG. 6, the highly selective frequency characteristic slightly shifts over the given frequency band.

Figure 7:
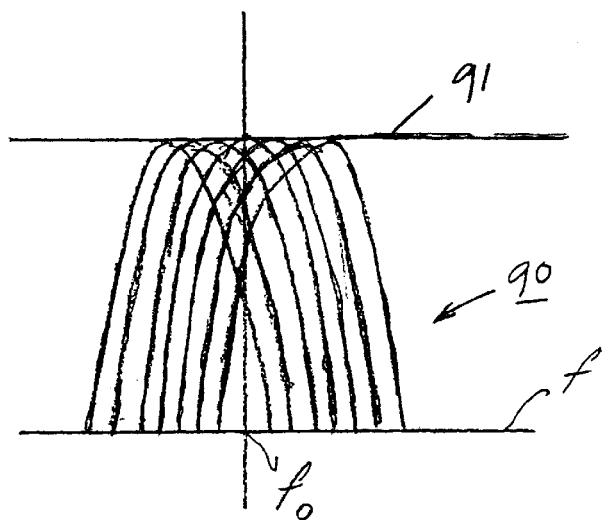
FIG. 7 further illustrates operation of the invention.

FIG. 7 further illustrates operation of the invention. Shown are frequency characteristics 90 of the tank circuit 9 that shift in small frequency steps from a middle frequency characteristic at $f=f_0=2.45$ GHz to outer edges of the frequency band. The steps may be in increments of a physical channel within the frequency band, or in any other suitable increment. Tuning may be done in a discrete or continuous way. Herewith, in accordance with the invention, effectively, a substantially flat frequency characteristic is obtained over the entire frequency band, as shown with solid line 91.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A transmitter comprising:
    frequency generating means for generating a first signal at a first frequency, said frequency generating means including first tank means for resonating at said first frequency;

frequency multiplication means for multiplying said first signal by an integral multiple of a fundamental frequency of said first signal, said frequency multiplication means including second tank means for resonating at an harmonic frequency of said fundamental frequency, said harmonic frequency being determined by said integral multiple, and said frequency multiplication means including output means for outputting a second signal at said harmonic frequency, said first tank means being highly frequency selective around said first frequency, and said second tank means being highly frequency selective around said harmonic frequency;

tuning means for simultaneously tuning said first and second tank means; and up-converting means using said second signal for up-conversion of a transmit signal.

2. A transmitter as claimed in claim 1, wherein said tuning means is configured to tune said second tank means over a given frequency band, in frequency increments of physical channels of said frequency band.

3. A transmitter as claimed in claim 2, wherein said physical channels have narrow channel band widths as compared to said given frequency band.

4. A transmitter as claimed in claim 1, wherein said first tank means comprises first frequency determining elements and said second tank means comprises second frequency determining elements, said first and second frequency determining elements being first on-chip matching elements.

5. A transmitter as claimed in claim 4, wherein said first on-chip matching elements comprise unitary capacitive elements and unitary inductive elements.

6. A transmitter as claimed in claim 1 wherein said frequency generating means comprises first active elements and said frequency multiplying means comprises second active elements, said first and second active elements being second on-chip matching elements.

7. A transmitter as claimed in claim 6, wherein said first and second active elements comprise bipolar transistors with matching emitter areas.

8. A transmitter as claimed in claim 6, wherein said first and second active elements comprise field effect transistors comprised of unitary channel dimensions.

9. A transmitter as claimed in claim 5, wherein said first tank means comprises a first number of said unitary capacitive elements and a second number of said unitary inductive elements, and said second tank means comprises a third number of said unitary capacitive elements and a forth number of said unitary capacitive elements, said first number being a first multiple of said third number, and said second number being a second multiple of said forth number.

10. A transmitter as claimed in claim 9, wherein said first multiple is equal to said second multiple.

11. A transmitter as claimed in claim 1, wherein said first tank means comprises a first varactor, and said second tank means comprises a second varactor, said first and second varactors being comprised in said tuning means.

12. A transceiver comprising:

frequency generating means for generating a first signal at a first frequency, said frequency generating means including first tank means for resonating at said first frequency;

frequency multiplication means for multiplying said first signal by an integral multiple of a fundamental frequency of said first signal, said frequency multiplication means including second tank means for resonating at an harmonic frequency of said fundamental frequency, said harmonic frequency being determined by said integral multiple, and said frequency multiplication means including output means for outputting a second signal at said harmonic frequency, said first tank means being highly frequency selective around said first frequency, and said second tank means being highly frequency selective around said harmonic frequency;

tuning means for simultaneously tuning said first and second tank means.

13. A transceiver as claimed in claim 12, wherein said tuning means is configured to tune said second tank means over a given frequency band, in frequency increments of physical channels of said frequency band.

14. A transceiver as claimed in claim 13, wherein said physical channels have narrow channel band widths as compared to said given frequency band.

15. A transceiver as claimed in claim 12, wherein said first tank means comprises first frequency determining elements and said second tank means comprises second frequency determining elements, said first and second frequency determining elements being first on-chip matching elements.

16. A transceiver as claimed in claim 15, wherein said first on-chip matching elements comprise unitary capacitive elements and unitary inductive elements.

17. A transceiver as claimed in claim 12, comprising a transmitter with up-converting means using said second signal for up-conversion of a transmit signal.

18. A transceiver as claimed in claim 17, further comprising a receiver with down-converting means, said down-conversion means using said second signal for down-conversion of a received signal.

19. A transceiver as claimed in claim 12, comprising a receiver with down-converting means using said second signal for down-conversion of a received signal.

20. A receiver comprising:

frequency generating means for generating a first signal at a first frequency, said frequency generating means including first tank means for resonating at said first frequency;

frequency multiplication means for multiplying said first signal by an integral multiple of a fundamental frequency of said first signal, said frequency multiplication means including second tank means for resonating at an harmonic frequency of said fundamental frequency, said harmonic frequency being determined by said integral multiple, and said frequency multiplication means including output means for outputting a second signal at said harmonic frequency, said first tank means being highly frequency selective around said first frequency, and said second tank means being highly frequency selective around said harmonic frequency;

tuning means for simultaneously tuning said first and second tank means; and down-conversion means using said second signal for down-conversion of a received signal.

* * * * *